United States Patent [19]

Yamamoto et al.

[11] 4,314,595

[45] Feb. 9, 1982

[54] METHOD OF FORMING NONDEFECTIVE ZONE IN SILICON SINGLE CRYSTAL WAFER BY TWO STAGE-HEAT TREATMENT

[75] Inventors: Kazuhiko Yamamoto, Yokohama; Yoshiaki Matsushita; Masaru Kanamori, both of Tokyo; Kazutoshi Nagasawa, Yokohama; Naotsugu Yoshihiro, Matsudo; Seigo Kishino, Hachioji, all of Japan

[73] Assignee: VLSI Technology Research Association, Japan

[21] Appl. No.: 110,456

[22] Filed: Jan. 8, 1980

[30] Foreign Application Priority Data

Jan. 19, 1979 [JP] Japan ................................. 54-4929

[51] Int. Cl.³ .................... H01L 21/322; H01L 7/52
[52] U.S. Cl. .................................. 148/1.5; 148/187; 357/91
[58] Field of Search ................... 148/1.5, 187; 357/91

[56] References Cited

U.S. PATENT DOCUMENTS

| | | | |
|---|---|---|---|
| 3,997,368 | 12/1976 | Petroff | 148/1.5 |
| 4,116,719 | 9/1978 | Shimizu et al. | 148/1.5 |
| 4,135,951 | 1/1979 | Stone | 148/1.5 |
| 4,144,100 | 3/1979 | MacIver | 148/1.5 |
| 4,149,905 | 4/1979 | Levinstein et al. | 148/1.5 |
| 4,220,483 | 9/1980 | Cazcarra | 148/1.5 |

OTHER PUBLICATIONS

Maher et al., Jour. Appl. Phys. 47, (Sep. 1976) 3813.
Shimizu et al., Jap. Jour. Appl. Phys. 17, (1978) 767.
Murarka et al., Jour. Appl. Phys. 48, (1977) 46.
Rozgoni, et al., J. Electrochem. Soc. 122, (1975) 1725.
Glowinke et al., J. Phys. Chem. Solids 38, (1977) 963.
Hu, S. M., Appl. Phys. Letts. 27, (1975) 165.
Rozgonyi et al., Appl. Phys. Letts. 31, (1977) 343.
Tan et al., Appl. Phys. Letts. 30, (1977) 175.

*Primary Examiner*—Upendra Roy
*Attorney, Agent, or Firm*—Finnegan, Henderson, Farabow, Garrett & Dunner

[57] ABSTRACT

A silicon single crystal wafer is subjected to two-stage heat treatment. In the first-stage it is heated at a temperature within the range of between 500° C. and 1,000° C. Subsequently the thus heated wafer is heated at a temperature higher than that at the first stage. Thus, a nondefective zone is formed in the surface region of the wafer, and the interior zone of the wafer becomes rich in micro defects capable of gettering impurities such as heavy metals.

13 Claims, 4 Drawing Figures

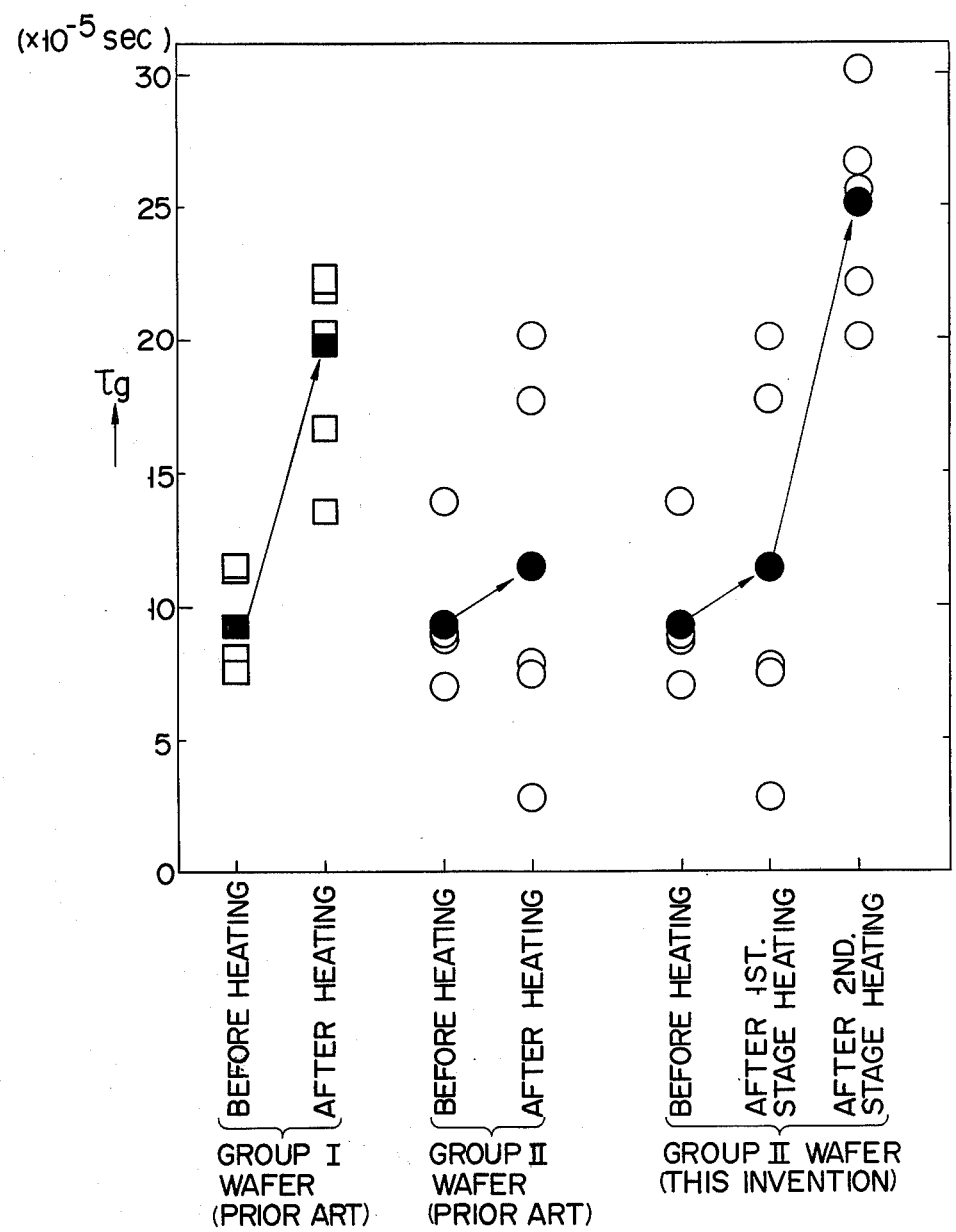

1

METHOD OF FORMING NONDEFECTIVE ZONE IN SILICON SINGLE CRYSTAL WAFER BY TWO STAGE-HEAT TREATMENT

BACKGROUND OF THE INVENTION (I) Field of the Invention

This invention relates to a method of selectively eliminating a defective zone of a silicon single crystal wafer, and more particularly to a method of forming a nondefective zone in such a wafer by means of heat treatment.

(II) Description of the Prior Art

It is naturally desirable that a silicon wafer used for producing semiconductor devices such as an IC device and an LSI device be nondefective. Crystal dislocations or defects themselves or impurities such as heavy metals gettered by them form a deep level trap center which causes deterioration of semiconductor properties including occurrence of soft breakdown at p-n junctions, decrease of amplification factor and shortening in the life time of minority carrier.

Recently, a method for eliminating such crystal dislocation by heat-treating a silicon single crystal wafer under a non-oxidizig atmosphere has been proposed. According to this method, a wafer is heated at 1,050° C. so as to cause surplus oxygen over the solid solubility limit to precipitate at defect-causing nuclei present within the wafer crystal. As a result, micro defects capable of gettering impurities such as heavy metals are formed in the interior zone of the wafer at a high concentration. On the other hand, oxygen present in the surface region of the wafer and involved in the formation of micro defects is diffused outside the wafer, resulting in formation of a nondefective zone in the wafer surface region. The nondefective zone thus formed is thick enough to form therein an active semiconductor region.

However, rapid progress has been recently achieved in the technique of producing single crystals by improvements in the crucible material, the manufacturing atmosphere, etc., rendering it possible to produce a silicon single crystal which scarcely contains defect-causing nuclei or contains very small nuclei, if present. It has been found that if the prior art outlined above is applied to such a silicon single crystal wafer, micro defects serving to getter impurities such as heavy metals are difficult to form within the wafer. Consequently, the prior art outlined above fails to improve the properties of such a wafer.

SUMMARY OF THE INVENTION

An object of this invention is to provide a method of forming a nondefective zone in a silicon single crystal wafer, which, even if applied to a silicon single crystal wafer containing no or little defect-causing nuclei, permits forming a nondefective zone in the wafer surface region and an interior zone rich in micro defects capable of gettering impurities such as heavy metals.

According to this invention, there is provided a method of forming a nondefective zone in a silicon single crystal wafer comprising:

- a first-stage heat treatment of heating the silicon single crystal wafer at a temperature within the range of between 500° C. and 1000° C.; and
- a second-stage heat treatment of heating the thus treated wafer at a temperature higher than that used in first-stage thereby converting the surface region of the wafer into a nondefective zone.

BRIEF DESCRIPTION OF THE DRAWING

FIG. 2 is a graph showing the life time of minority carrier with respect to wafers treated by the method of this invention and by the conventional method.

DETAILED DESCRIPTION OF THE PREFERRED EMBODIMENTS

Figure 1A:
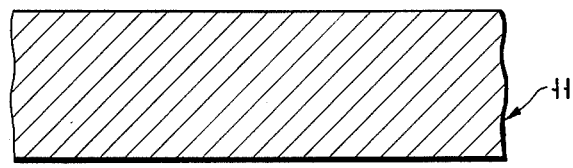
FIGS. 1A to 1C are schematic cross sectional views collectively showing the changes in the state of a wafer treated by the method of this invention.

This invention will now be described with reference to the drawing.

First, a silicon single crystal wafer 11 is provided as shown in FIG. 1A. As is well known in the art, the wafer 11 can be obtained by, for example, cutting a Czochralski-grown silicon single crystal ingot. The wafer 11 scarcely contains defect-causing nuclei. If applied to a wafer scarcely containing defect-causing nuclei, the method of this invention is particularly advantageous over the conventional method of one-stage heating, though, of course, the invented method produces an appreciable effect even if applied to a wafer rich in defect-causing nuclei.

Figure 1B:
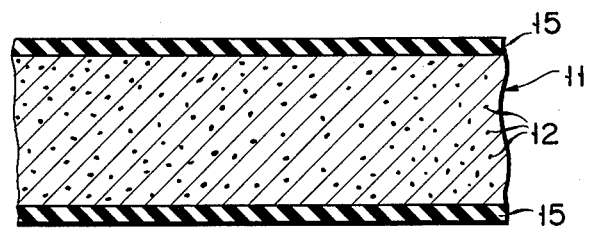

According to this invention, the wafer 11 is subjected to two-stage heat treatment. In the first-stage, the wafer 11 is heated at a temperature within the range of 500° C. to 1,000° C. so as to a form a large number of defect-causing nuclei 12 within the wafer 11 as shown in FIG. 1B. The impurities unavoidably entering the silicon single crystal in the manufacturing step thereof, etc. are involved in the formation of the nuclei 12 in the first-stage heat treatment of the wafer. If the heating temperature does not fall within the range of between 500° C. and 1,000° C., the nuclei 12 are not sufficiently formed within the wafer 11. Preferably, the heating temperature should be within the range of between 700° C. and 900° C. Generally, the first-stage treatment is conducted for a period of time sufficient to create defect-causing nuclei sufficiently. Usually it is carried out for 10 to 100 hours, preferably, for 16 to 64 hours.

Figure 1C:
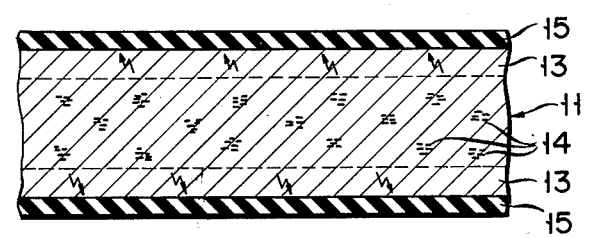

The wafer 11 subjected to the first-stage heat treatment is further subjected to a second-stage heat treatment at a temperature higher than that used in first-stage so as to form micro defects 14 at a high concentration within the wafer 11 as shown in FIG. 1C. Specifically, the oxygen contained in the wafer precipitates at the nuclei 12 in the second-stage heat treatment so as to form the micro defects 14. It is important to note that the oxygen dissolved in the surface region of the wafer is diffused outside the wafer in the step of second-stage heat treatment so as to form a nondefective zone (or denuded zone) 13. To be brief, the second-stage heat treatment serves to form an interior zone rich in the micro defects 14 and the non-defective zone 13. Principally, the second-stage heat treatment may well be carried out at a temperature higher than that at the first-stage as mentioned above, but usually carried out at a temperature within the range of between 1,000° C. and 1,300° C., preferably, between 1,000° C. and 1,150° C. As appreciated from the above, the second-stage heat treatment is conducted for a period of time sufficient to create micro defects at a high concentration within the interior region of the wafer, mainly involving the defect-causing nuclei formed in the first-stage heat treatment and to convert the surface region of the wafer into a nondefective zone by outdiffusion of dissolved oxygen at the surface region. Generally it is carried out for 10 to 100 hours, preferably 16 to 64 hours.

The nondefective zone 13 has a depth sufficient to permit an active device region to be formed therein (several microns deep). On the other hand, the micro defects 14 formed in the interior zone exhibit a gettering effect, namely, serve to adsorb impurities unavoidably contained in the wafer and impurities like heavy metals coming from the outside in producing a semiconductor element. In other words, the micro defects 14 serve to prevent the undesired impurities from remaining within the active semiconductor regions formed within the nondefective zone 13. It follows that semiconductor devices such as an IC and an LSI exhibiting excellent properties can be produced by using a wafer treated by the present method.

It is possible to apply the first- and second-stage heat treatments under a reducing atmosphere (hydrogen), a neutral atmosphere (inert gas like $N_2$) or an oxidizing atmosphere (oxygen), though an oxidizing atmosphere is preferred because the treated wafers are smaller in variation of properties. If the wafer 11 is heated under an oxidizing atmosphere, oxide films 15 are formed as shown in FIGS. 1B and 1C. The oxide films 15 may be utilized in the subsequent step of forming active device regions within the wafer or they may be removed.

This invention will be more fully understood from the following examples.

EXAMPLES

The following experiments were conducted in order to compare the method of this invention with the conventional method.

Wafers each having a (100) plane were cut off from two kinds of p-type silicon single crystal ingot produced by Czochralski method under different conditions, and classified into Groups I and II corresponding to the ingots, respectively. The wafers of Group I were found to exhibit an average minority carrier life time of $9.2 \times 10^{-5}$ second. On the other hand, the wafers of Group II were found to exhibit an average minority carrier life time of $9.4 \times 10^{-5}$ second. Further, the wafers of Groups I and II were found to have a resistivity of 1 to 2 Ω·cm.

Some of the wafers of Groups I and II were each subjected to a heat treatment at 1,050° C. under nitrogen atmosphere in accordance with the prior art method in order to look into the change in the minority carrier life time caused by the heat treatment. FIG. 2 shows the results. The black dots shown in FIG. 2 represent the average values. It is seen that the average minority carrier life time for Group I was as high as $19.4 \times 10^{-5}$ second after the heat treatment in contrast to $11.6 \times 10^{-5}$ second for Group II. It is considered from the results that the Group I wafer was rich in defect-causing nuclei and the Group II wafer was poor in defect-causing nuclei.

Then, the remaining Group II wafers having a smaller number of defect-causing nuclei were subjected to a two-stage heat treatment in accordance with the method of this invention. Specifically, each wafer was heated under oxygen at 800° C. for 64 hours (first-stage) and, then, at 1,050° C. for 64 hours (second-stage). FIG. 2 also shows the minority carrier life time of the wafer after each of the first- and second-stage heat treatments. It is seen that the average life time after the second-stage heat treatment was as high as $25.2 \times 10^{-5}$ second, which is far higher than for the case where the prior art was applied to the wafer rich in defect-causing nuclei, not to mention the case where the prior art was applied to the wafer having a smaller number of defect-causing nuclei.

What we claim is:

1. A method of forming a nondefective zone in a silicon single crystal wafer comprising:
   a first-stage heat treatment of heating the wafer for ten (10) to one hundred (100) hours at a temperature within the range of between 500° C. and 1000° C. to form a number of defect-causing nuclei within the wafer; and
   a second-stage heat treatment of heating the thus treated wafer at a temperature higher than that used in the first-stage, thereby converting the surface region of the wafer into a nondefective zone and forming a micro defect-rich zone at the interior center region of the wafer, the defect-causing nuclei being mainly involved in the formation of the micro defects in the second-stage heat treatment.

2. The method according to claim 1, wherein the first-stage heat treatment is carried out at a temperature within the range of between 700° C. and 900° C.

3. The method according to claim 1, wherein the second-stage heat treatment is carried out at a temperature within the range of between 1,000° C. and 1,300° C.

4. The method according to claim 3, wherein the second-stage heat treatment is carried out at a temperature within the range of between 1,000° C. and 1,150° C.

5. The method according to claim 1, wherein the first-stage heat treatment is carried out for 10 to 100 hours.

6. The method according to claim 5, wherein the first-stage heat treatment is carried out for 16 to 64 hours.

7. The method according to claim 1, wherein the second-stage heat treatment is carried out for 10 to 100 hours.

8. The method according to claim 7, wherein the second-stage heat treatment is carried out for 16 to 64 hours.

9. The method according to any of claims 1 to 8, wherein the first-stage heat treatment is carried out under a reducing atmosphere, a neutral atmosphere or an oxidizing atmosphere.

10. The method according to any of claims 1 to 8, wherein the second-stage heat treatment is carried out under a reducing atmosphere, a neutral atmosphere or an oxidizing atmosphere.

11. A method of forming a nondefective zone in a silicon single crystal wafer comprising:
   a first-stage heat treatment of heating the wafer for ten (10) to one hundred (100) hours at a temperature within the range of between 500° C. and 800° C. to form a number of defect causing nuclei within the wafer; and
   a second-stage heat treatment of heating the thus treated wafer at a temperature higher than that used in the first-stage, thereby converting the surface region of the wafer into a nondefective zone and forming a micro defect-rich zone at the interior center region of the wafer, the defect causing nuclei being mainly involved in the formation of the micro defects in the second-stage heat treatment.

12. The method according to claim 1, wherein the second-stage heat treatment is carried out at a temperature within the range of between 1,000° C. and 1,150° C.

13. The method according to any of claims 1, 11, or 12, wherein both the first-stage and second-stage heat treatments are carried out under either a reducing atmosphere or a neutral atmosphere.

* * * * *